(12) United States Patent
Chen

(10) Patent No.: US 7,267,557 B2
(45) Date of Patent: Sep. 11, 2007

(54) MICRO CONTACT DEVICE COMPRISING THE MICRO CONTACT ELEMENT AND THE BASE MEMBER

(75) Inventor: Chih-Chung Chen, Taipei (TW)

(73) Assignee: MJC Probe Incorporation (TW)

( * ) Notice: Subject to any disclaimer, the term of this patent is extended or adjusted under 35 U.S.C. 154(b) by 0 days.

(21) Appl. No.: 11/340,707

(22) Filed: Jan. 27, 2006

(65) Prior Publication Data

US 2006/0172568 A1 Aug. 3, 2006

(30) Foreign Application Priority Data

Feb. 3, 2005 (TW) .............................. 94103472 A

(51) Int. Cl.
*H01R 12/00* (2006.01)
(52) U.S. Cl. ....................................................... 439/81
(58) Field of Classification Search .................. 439/81, 439/862; 324/754, 761, 762
See application file for complete search history.

(56) References Cited

U.S. PATENT DOCUMENTS

| | | | |
|---|---|---|---|
| 5,974,662 A | 11/1999 | Eldridge et al. | |
| 6,268,015 B1 | 7/2001 | Mathieu et al. | |
| 6,399,900 B1 | 6/2002 | Khoury et al. | |
| 6,414,501 B2 * | 7/2002 | Kim et al. | ................... 324/754 |
| 6,692,145 B2 * | 2/2004 | Gianchandani et al. | ..... 374/185 |
| 6,807,734 B2 * | 10/2004 | Eldridge et al. | .............. 29/874 |
| 7,047,638 B2 * | 5/2006 | Eldridge et al. | .............. 29/884 |
| 2001/0012739 A1 | 8/2001 | Grube et al. | |

* cited by examiner

*Primary Examiner*—Neil Abrams
(74) *Attorney, Agent, or Firm*—Browdy and Neimark PLLC

(57) ABSTRACT

A micro contact element made by photolithography technology includes a suspension arm having a first long side and a second long side opposite to the first long side, a point connected to an end of the first long side of the suspension arm and extending perpendicularly from the suspension arm, and an insertion portion perpendicularly extending from the second long side of the suspension arm. The insertion portion is to be inserted a hole of a base member having circuitry thereon. The insertion portion may be formed by layers of deposited material or may be a springy member. The suspension member may include an intermediate deformable portion to adjust stiffness.

6 Claims, 12 Drawing Sheets

MICRO CONTACT DEVICE COMPRISING THE MICRO CONTACT ELEMENT AND THE BASE MEMBER

BACKGROUND OF THE INVENTION

1. Field of the Invention

The present invention relates to a micro contact element (probe) used as a connecting medium between a test apparatus and a device under test, a base member for mounting of the micro contact element and a micro contact device (probe card) comprising the micro contact element and the base member, and more particularly to such a micro contact element that is insertable into the base member when assembling to form the micro contact device. The present relates also to methods of making respectively the micro contact element and the base member for the micro contact element.

2. Description of the Related Art

When testing high-density or high-speed electrical devices (for example, LSI or VLSI circuits), a probe card having a big amount of micro contact elements (probes) shall be used. By means of the flexible and electrically conductive property of the micro contact elements, the probe card is used as an electric connection medium between the test apparatus and the device under test, for example, an LSI chip, VLSI chip, semiconductor wafer, semiconductor chip, semiconductor package, printed circuit board, or LCD panel. Micro contact elements can also be used as lead wire means for an IC package. For easy understanding of the present invention, the micro contact elements described hereinafter can be treated, but not limited to, as probes for probe cards.

U.S. Pat. No. 6,268,015 discloses a method of forming an interconnection, including a spring contact element, by lithographic techniques. A spring contact element made according to this method, as shown in FIG. 1, includes a post portion 3, a beam portion 2, and a tip structure portion 1. This method requires several assembly procedures to bonding the post portion 3, beam portion 2 and the tip structure portion 1 in position together after formation of the aforesaid elements by respective metal-depositing processes, easily resulting in improper positioning of the tip structure portion and low uniformity of the spring contact elements of the probe card.

According to U.S. patent publication serial No. 20010012739, the contact element is made by metal deposition by means of micro electromechanical techniques. However, the point (tip structure) is bonded to the beam by welding, and the post (contact element base) is made by wire bonding with the outside wall electroplated with a metal coating. The wire bonding process for making the post is complicated and requires much manufacturing time. Further, this method requires high precision control techniques.

U.S. Pat. No. 6,399,900 discloses a contact structure for achieving an electrical connection with a contact target, which is formed by producing a contactor on a planar surface of a substrate by microfabrication technology. The tip of the contactor is also bonded to an end of the beam by welding and the beam has the other end thereof merely attached to the planner surface of the substrate via the adhesion between metal and substrate, thereby lowering the stability of the contactor. The contactor might detach from the planner surface of the substrate due to fatigue under long-lasting and repeated operation. Furthermore, if the positioning of the tip bonded to the beam by welding is inaccurate due to inaccuracy welding process, the uniformity of contact force applied on each tip will deteriorate so as to degrade the quality of probing and testing accuracy.

Further, U.S. Pat. No. 5,974,662 discloses a probe card assembly, which includes a probe card, a space transformer having resilient contact structures (probe elements) mounted directly to and extending from terminals on a surface thereof, and an interposer disposed between the space transformer and the probe card. The space transformer and interposer are "stacked up" so that the orientation of the space transformer, hence the co-planarity of the tips of the probe elements, can be adjusted without changing the orientation of the probe card. However, this design has a complicated structure, and the long transmission path is not suitable for high frequency transmission.

SUMMARY OF THE INVENTION

The present invention has been accomplished under the circumstances in view. It is the primary objective of the present invention to provide a micro contact element, which has an insertion portion that can be accurately and firmly inserted into a base member in one single process in position, improving the performance uniformity and reliability.

It is another objective of the present invention to provide a micro contact element, which is integrally made having a great accuracy in profile.

It is still another objective of the present invention to provide a micro contact element, which is insertable into a base member to provide better support and positioning effects.

It is still another objective of the present invention to provide a micro contact element, which has a relatively shorter signal transmission path suitable for high frequency transmission.

To achieve the above-mentioned objectives, the micro contact element provided by the present invention is made by a photolithography technology. The contact element comprises a suspension arm having a first long side and a second long side opposite to the first long side, a point connected to an end of the first long side of the suspension arm and extending perpendicularly from the suspension arm, and an insertion portion perpendicularly extending from the second long side of the suspension arm.

Another objective of the present invention is to provide a micro contact device comprising a base member into which the micro contact element is inserted. The base member includes a substrate having an insertion hole into which the insertion portion of the micro contact element is inserted, a receiving chamber for suspending therein a part of the suspension arm, and a coupling groove for mounting of a part of the suspension arm.

In an aspect, the present invention is to provide a method for making the micro contact element by photolithography technology.

In another aspect, the present invention is to provide a method for making the base member for insertion of the micro contact element by photolithography technology.

DETAILED DESCRIPTION OF THE INVENTION

Figure 1:
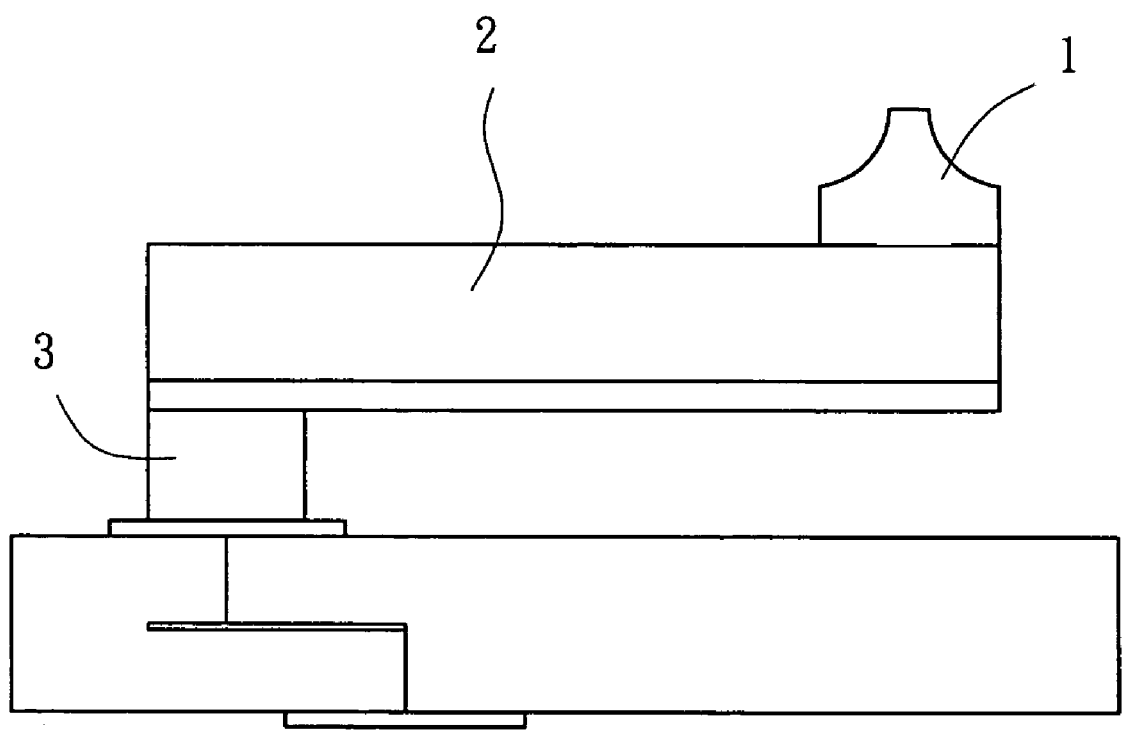
FIG. 1 is a schematic drawing showing a probe according to U.S. Pat. No. 6,268,015.
Figure 2A:
FIG. 2a to FIG. 2ff are schematic drawings, showing sequent steps of making a micro contact element according to the present invention.
Figure 2B:
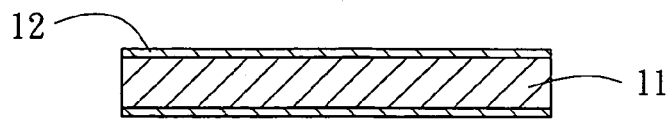
Figure 2C:
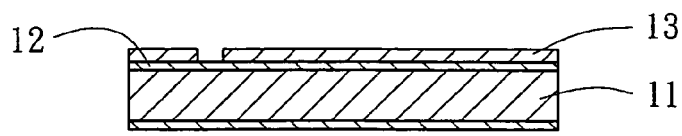
Figure 2D:
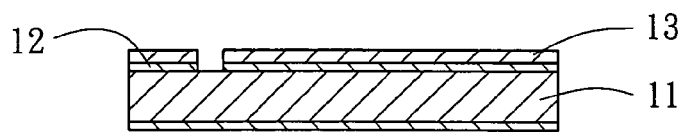
Figure 2E:
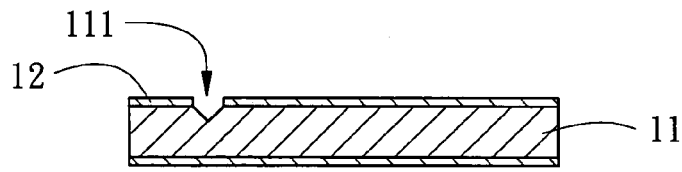
Figure 2F:
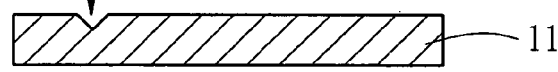
Figure 2G:
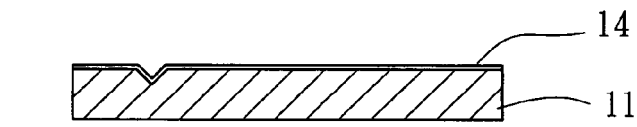
Figure 2H:
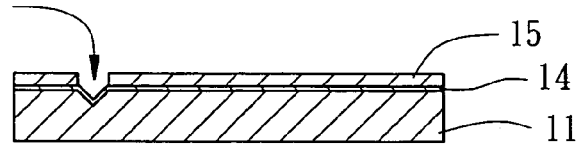
Figure 2I:
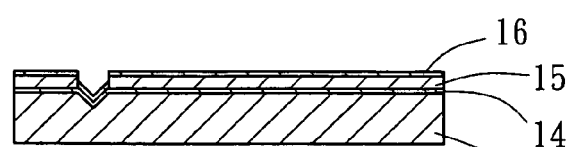
Figure 2J:
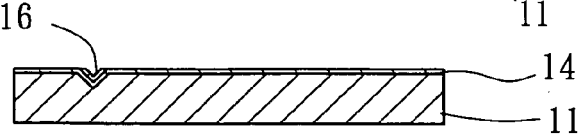
Figure 2K:
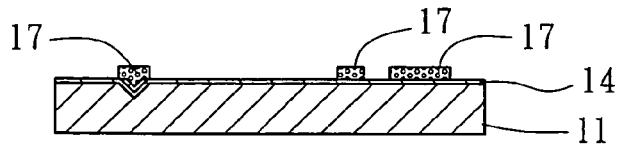
Figure 2L:
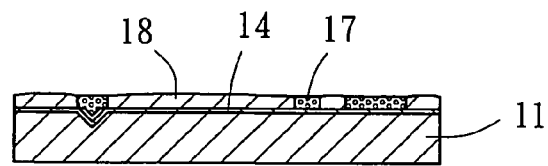
Figure 2M:
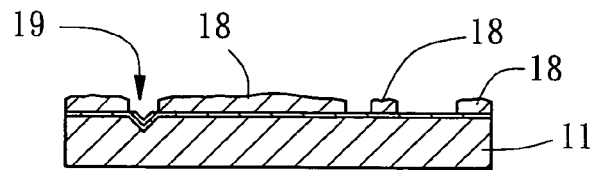
Figure 2N:
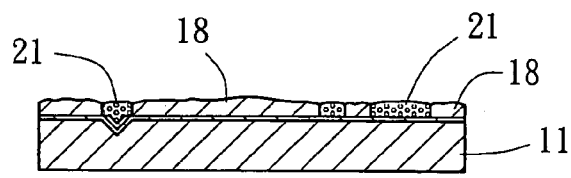
Figure 2O:
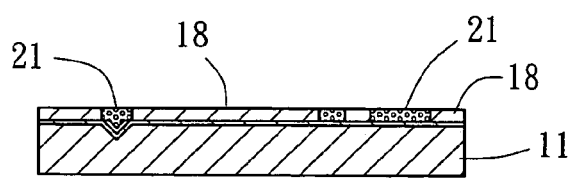
Figure 2P:
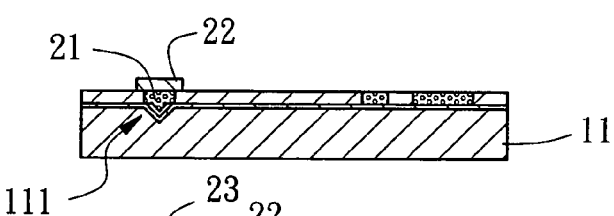
Figure 2Q:
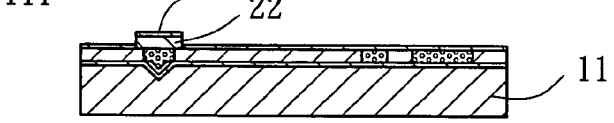
Figure 2R:
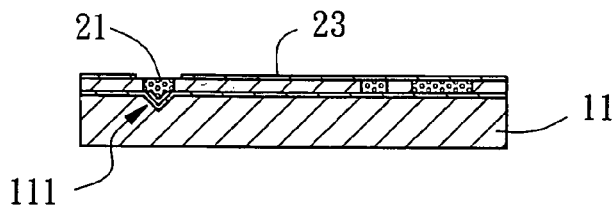
Figure 2S:
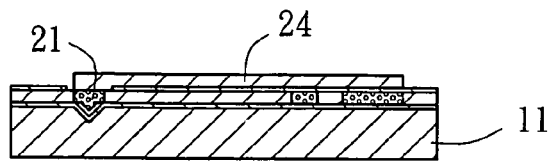
Figure 2T:
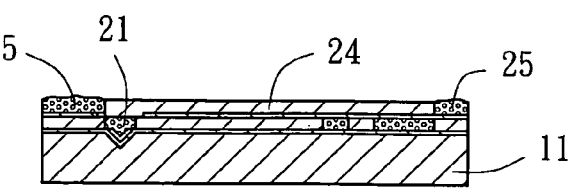
Figure 2U:
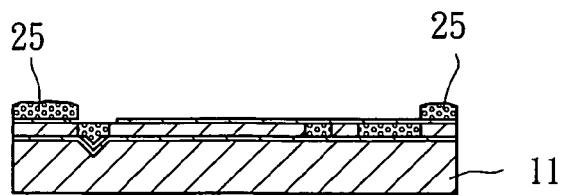
Figure 2V:
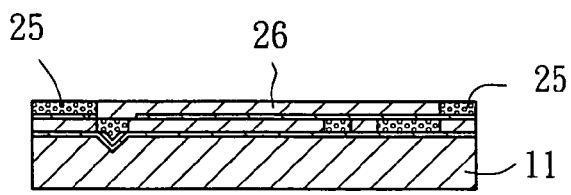
Figure 2W:
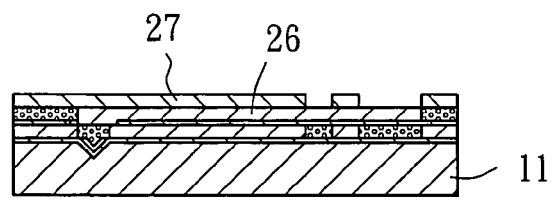
Figure 2X:
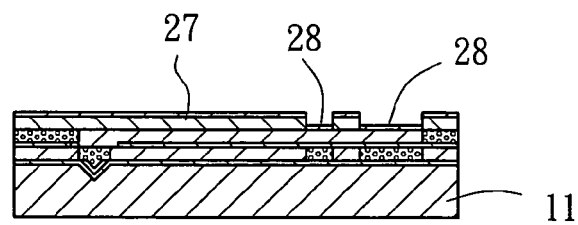
Figure 2Y:
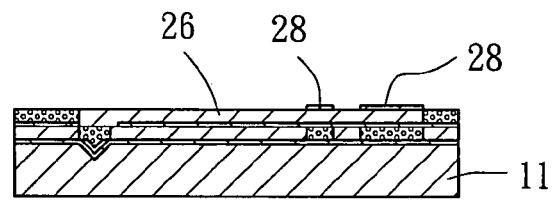
Figure 2Z:
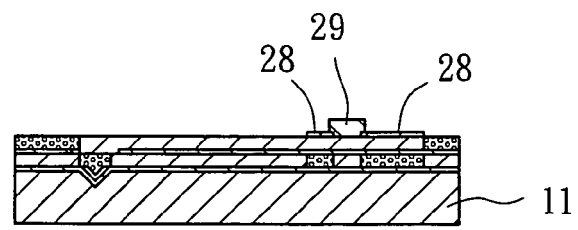
Figure 2A:
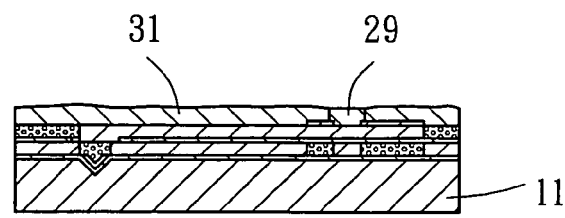
Figure 2B:
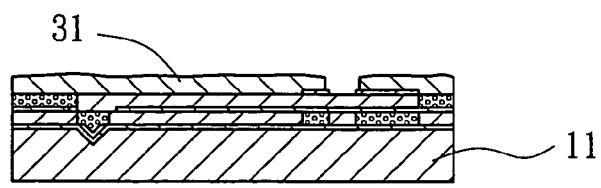
Figure 2C:
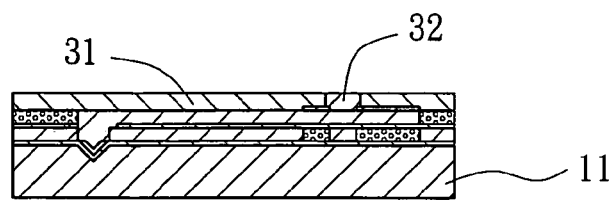
Figure 2D:
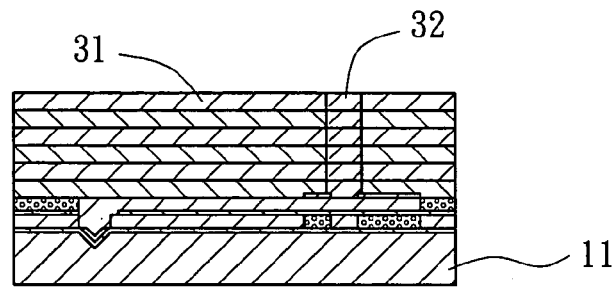
Figure 2E:
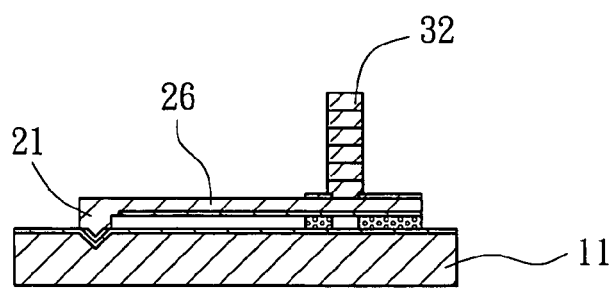
Figure 2F:
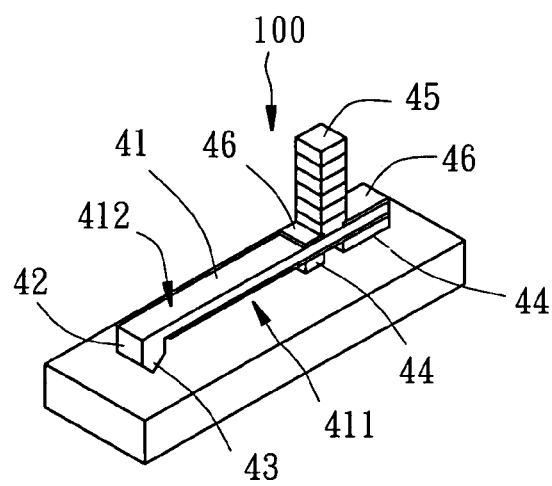

Referring to FIG. 2a to FIG. 2ff, a method for making a micro contact element in accordance with a preferred embodiment of the present invention comprises the steps of:

(A) preparing a substrate 11, i.e., single-crystal silicon material, as shown in FIG. 2a;

(B) depositing a layer of dielectric film 12 of silicon nitride material on the top surface of the substrate 11 by means of LPCVD (low pressure chemical vapor deposition) or diffusion, as shown in FIG. 2b;

(C) covering a first shielding layer 13 on the dielectric film 12, forming an opening in the first shielding layer 13, and then performing photolithography process (photo-etching process used in semiconductor manufacturing process), as shown in FIG. 2c;

(D) removing a portion of the dielectric film 12, which is located under the opening of the first shielding layer 13, by means of RIE (reactive ion etching), so that a portion of the top surface of the substrate 11 is exposed outside as shown in FIG. 2d;

(E) removing the first shielding layer 13 and then etching the area of the substrate 11 not covered by the dielectric film 12, i.e. etching the exposed portion of the top surface of the substrate 11, with KOH or TMAH by means of anisotropic etching, thereby forming an inverted and truncated pyramid notch 111 on the substrate 11, as shown in FIG. 2e;

(F) removing the dielectric film 12 by means of high-temperature phosphoric acid etching or RIE, as shown in FIG. 2f, where the etching material and conditions are well selected so as not to affect the substrate;

(G) coating a conductive film 14 of, for example, titanium, on the surface of the substrate 11 by deposition such as evaporation deposition, sputtering deposition, or electroplating, as shown in FIG. 2g;

(H) coating the conductive film 14 with a second shielding layer 15 having an opening corresponding to the notch 111 of the substrate 11, as shown in FIG. 2h;

(I) coating one or more layers of reinforcing film 16 on the second shielding layer 15 and the conductive film 14 in the notch 111, as shown in FIG. 2i, wherein the reinforcing film 16 is obtained from a metal material having wear resisting, low adhesive and high conductive characteristics such as rhodium;

(J) removing the second shielding layer 15 by etching and simultaneously removing the reinforcing film 16 at the second shielding layer 15, as shown in FIG. 2j;

(K) forming a third shielding layer 17 locally on the conductive film 14, i.e., forming the third shielding layer 17 on the notch 111 and two local locations on the same side, as shown in FIG. 2k;

(L) depositing a first support material 18, i.e., copper or polymer, on the conductive film 14 by means or evaporation deposition, sputtering deposition, electroplating, or coating as shown in FIG. 2l;

(M) removing the third shielding layer 17 so as to form notches 19 in the first support material 18, as shown in FIG. 2m;

(N) depositing a first electroforming material 21 of, for example, nickel in the notches in the first support material 18, as shown in FIG. 2n;

(O) leveling the surface of the first electroforming material 21 and the first support material 18, as shown in FIG. 2o;

(P) forming a patterned fourth shielding layer 22 on the first electroforming material 21 corresponding to the notch 111 by means of photolithography technology as shown in FIG. 2p;

(Q) depositing a sacrificial layer 23 on the first electroforming material 21 and the first support material 18 and the fourth shielding layer 22 by means of evaporation deposition, sputtering deposition, or electroplating, as shown in FIG. 2q, where the sacrificial layer 23 can be made of titanium or copper;

(R) removing the fourth shielding layer 22, as shown in FIG. 2r so that the area at the first electroforming material 21 above the notch 111 is not covered with the sacrificial layer 23;

(S) coating the top surface of the first electroforming material 21 with a continuous fifth shielding layer 24 having openings, as shown in FIG. 2s;

(T) electroforming a second support material 25 in the openings of the fifth shielding layer 24, as shown in FIG. 2t;

(U) removing the fifth shielding layer 24, as shown in FIG. 2u;

(V) depositing a second electroforming material 26 in the recessed space left after removal of the fifth shielding layer 24, and then leveling the second electroforming material 26 and the second support material 25, as shown in FIG. 2v;

(W) covering a sixth shielding layer 27 having openings corresponding to the second location and the third location as shown in FIG. 2w;

(X) depositing a metal bonding layer 28 in the openings of the sixth shielding layer 27 by evaporation deposition, sputtering deposition, or electroplating, as shown in FIG. 2x, where the metal bonding layer 28 can be a single layer or multiple-layer structure and formed of one single metal material or multiple metal materials having good adhesion ability;

(Y) removing the sixth shielding layer 27, as shown in FIG. 2y;

(Z) covering a seventh shielding layer 29 between the metal bonding layers 28 respectively corresponding to the second location and third location, enabling the seventh shielding layer 29 to be covered over the end edges of the metal bonding layers 28, as shown in FIG. 2z;

(AA) depositing a third support material 31, as shown in FIG. 2aa;

(BB) removing the seventh shielding layer 29, as shown in FIG. 2bb;

(CC) depositing a third electroforming material 32 in the notch left in the third support layer 31 after removal of the seventh shielding layer 29, and then leveling the surface of the third support material 31 and the third electroforming material 32, as shown in FIG. 2cc;

(DD) repeating step (Z) to step (CC) several times to have the electroforming material be laminated to a predetermined height as shown in FIG. 2dd; and (EE) removing all support materials so as to obtain the desired micro contact element, as shown in FIG. 2ee. FIG. 2ff is a perspective view of the finished micro contact element. After the aforesaid micro contact element being mounted to a base member, remove the conductive film 14 by etching to separate the finished micro contact element from the substrate.

Further, the aforesaid 1st to 7th shielding layers can be formed of a photoresist.

Referring to FIG. 2ff, the micro contact element 100 comprises a suspension arm 41, which is formed of an electroforming material and has a first long side 411 and a second long side 412 opposite to the first long side 411, a point base 42 connected to and perpendicularly extending from one end of the first long side 411 of the suspension arm 41, a point 43 formed on the free end of the point base 42, two supplementary bonding portions 44 respectively extending from the other end of the first long side 411 of the suspension arm 41 in same direction as the point 43, an insertion portion 45 extending from the second long side 412 of the suspension arm 41 oppositely corresponding to a location between the two supplementary bonding portions 44, and two bonding portions 46 disposed at the second long side 412 of the suspension arm 41 at two sides of the insertion portion 45.

The aforesaid suspension arm 41 can be formed of multiple layers of metal to have good electrical conductivity and good mechanical wear-resisting characteristic against fatigue.

Alternatively, the suspension arm 41 can be formed of polysilicon by means of PECVD (plasma enhancement chemical vapor deposition) for the advantage of high mechanical wear-resisting characteristic.

Further, the suspension arm may be laminated with metal and dielectric materials so that at least one insulative shielding layer and one conductive layer for ground connection are provided on the outer side of the signal transmission layer. Alternatively, the suspension arm can be made of polymer or polyimide.

Figure 3A:
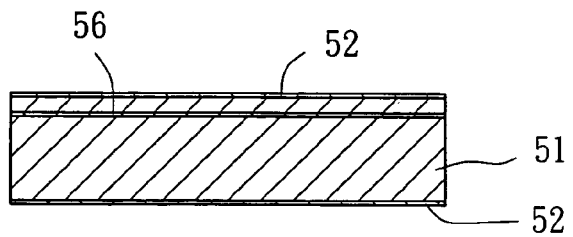
FIG. 3a to FIG. 3k are schematic drawings, showing sequent processes of making a base member for the micro contact element according to the present invention.
Figure 3B:
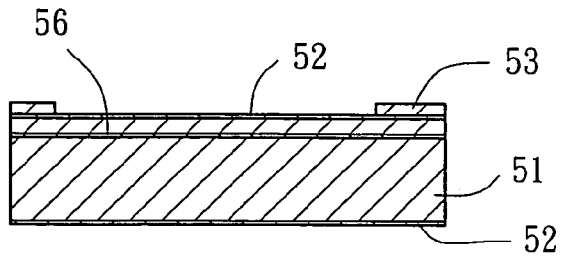

FIGS. 3a-3k show a process for making a base member 200 for the micro contact element according to the present invention. This process includes the steps of:

(A) preparing a silicon substrate 51 having embedded therein a silicon dioxide ($SiO_2$) lining layer 56, and then respectively covering the top and bottom surfaces of the silicon substrate 51 with a first shielding layer 52, as shown in FIG. 3a, wherein the first shielding layer 52 can be prepared from silicon dioxide, photoresist, silicon nitride, or aluminum.

Figure 3C:
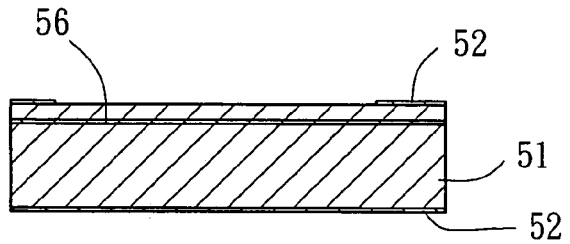
Figure 3D:
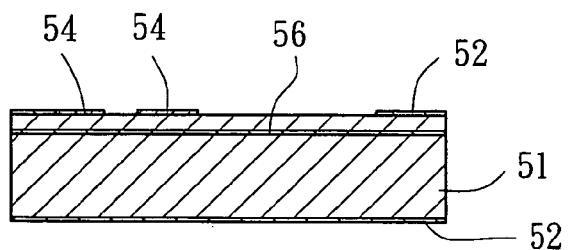
Figure 3E:
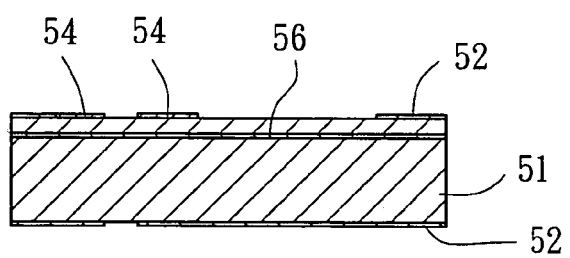
Figure 3F:
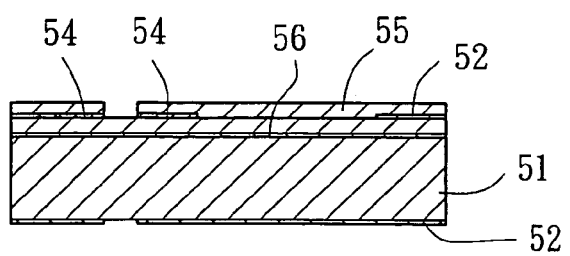
Figure 3G:
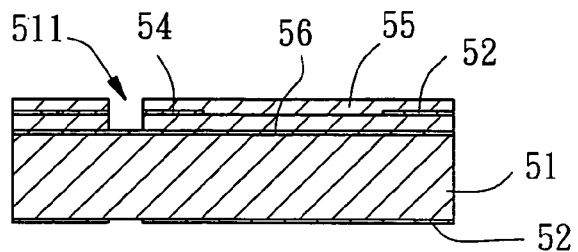
Figure 3H:
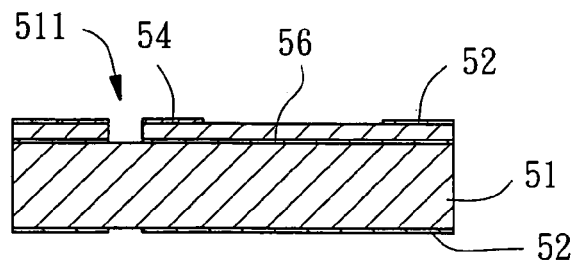
Figure 3I:
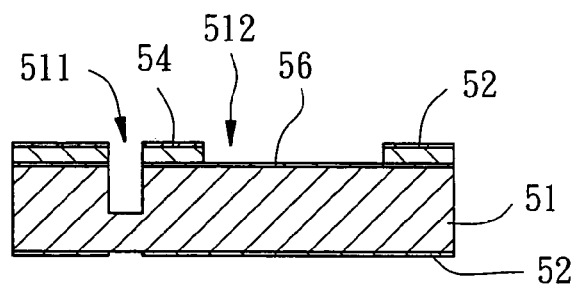
Figure 3J:
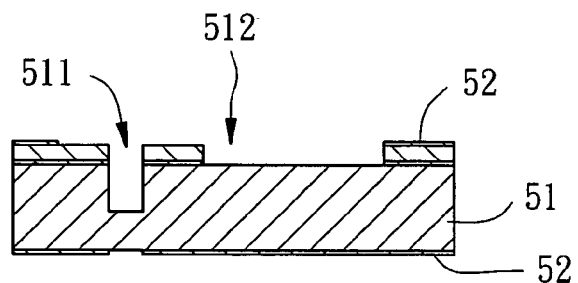
Figure 3K:
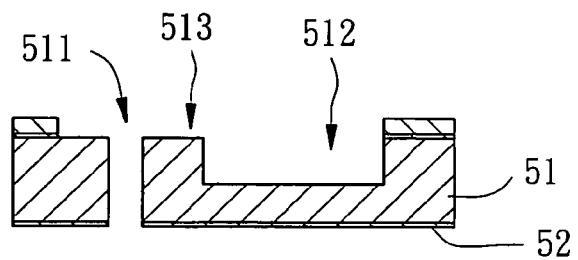

(B) forming on the first shielding layer 52 at the top side of the silicon substrate 51 a second shielding layer 53 having a patterned opening, as shown in FIG. 2b, wherein the second shielding layer 53 can be a photoresist;

(C) etching the first shielding layer 52 by RIE to remove the first shielding layer 52 from the opening of the second shielding layer 53, and then removing the second shielding layer 53 after RIE, as shown in FIG. 3c;

(D) covering a patterned third shielding layer 54 on the top side of the silicon substrate 51, as shown in FIG. 3d, wherein the third shielding layer covering process includes the steps of: (i) covering the top surface of the silicon substrate 51 a primary continuous layer formed of silicon dioxide or silicon nitride, (ii) forming a patterned mask layer on the primary continuous layer corresponding to the area to be maintained, (iii) removing the primary continuous layer beyond the mask layer by reactive ion etching, and (iv) removing the mask layer so that the desired third shielding layer having a patterned opening is formed on the silicon substrate (the processing of this patterned third shielding layer is of the known art, no further detailed description in this regard is necessary);

(E) patterning and opening in the first shielding layer 52 at the bottom side of the silicon substrate 51 by means of photolithography, RIE and photo resist strip process, similar process in step (D);

(F) covering on the top surface of the silicon substrate 51 a fourth shielding layer 55 having an opening corresponding to the opening of the third shielding layer 54 in communication with the silicon substrate 51 by means of photolithography, as shown in FIG. 3f;

(G) etching the area of the silicon substrate 51 outside the fourth shielding layer 55 by means of inductively coupled plasma reactive ion etching (ICP-RIE) to have the silicon dioxide lining layer 56 expose to the outside so that an insertion hole 511 is formed at the top side of the silicon substrate 51, as shown in FIG. 3g;

(H) etching the silicon dioxide lining layer 56 in the insertion hole 511 by RIE and then removing the fourth shielding layer 55, as shown in FIG. 3h;

(I) etching the silicon substrate 51 by means of ICP-RIE to deepen the insertion hole 511 to a predetermined depth and also etching the top surface of the silicon substrate 51 outside the first shielding layer 52 and the third shielding layer 54 to have the silicon dioxide lining layer 56 expose to the outside so that a receiving chamber 512 is formed on the top side of the silicon substrate 51, as shown in FIG. 3i;

(J) removing the third shielding layer 54 and the exposed silicon dioxide lining layer 56 by RIE, as shown in FIG. 3j; and (K) etching the top surface of the silicon substrate 51 by ICP-RIE to form a coupling groove 513 around the top side of the insertion hole 511, and then deepening the depth of the insertion hole 511 and the receiving chamber 512 to have the insertion hole 511 cut through the top and bottom surfaces of the silicon substrate 51, as shown in FIG. 3*k*.

Figure 4:
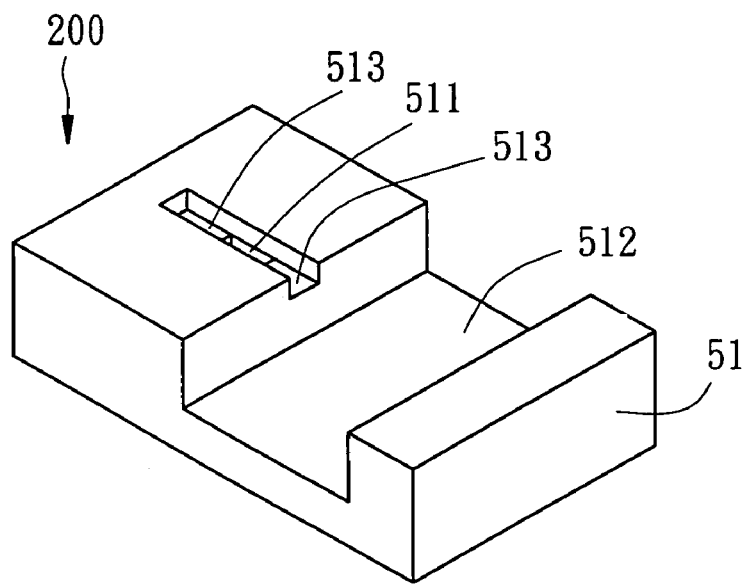
FIG. 4 is a perspective view of the base member made according to the processes shown in FIG. 3a to FIG. 3k.

FIG. 4 is a perspective view of the base member 200 for insertion type micro contact made according to this second embodiment.

Figure 5:
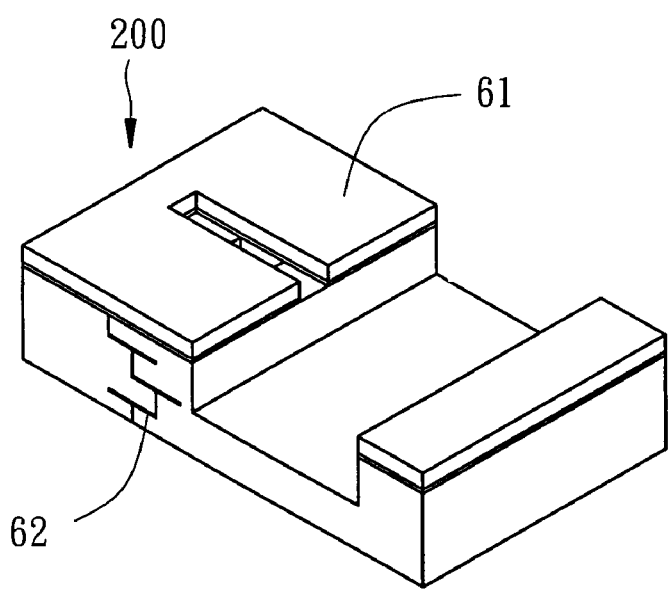
FIG. 5 is a perspective view of an alternate form of the base member for the micro contact element according to the present invention.

Referring to FIG. 5, the base member 200 may be made by making the desired groove and insertion hole in a ceramic or organic substrate that already has a circuit layout formed thereon by mechanical processing techniques. Thus, the base member 200 is a circuit board having the desired groove and insertion hole. Semiconductor technology may be employed to laminate a positioning structure of dielectric material 61 on the ceramic or organic substrate having a circuit layout 62.

Figure 6:
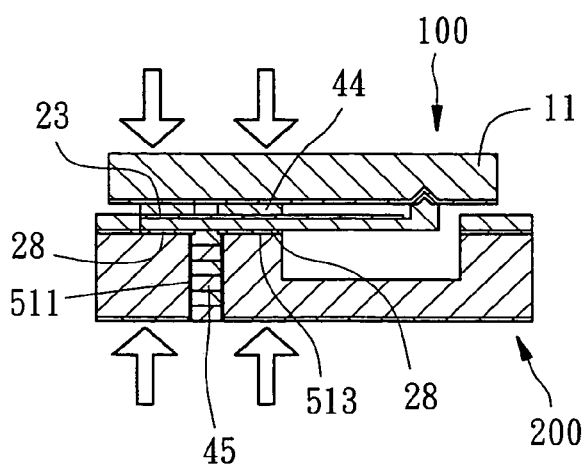
FIG. 6 is a schematic drawing, showing the installation process that the micro contact element is inserted into the base member to form a micro contact device according to the present invention.
Figure 7:
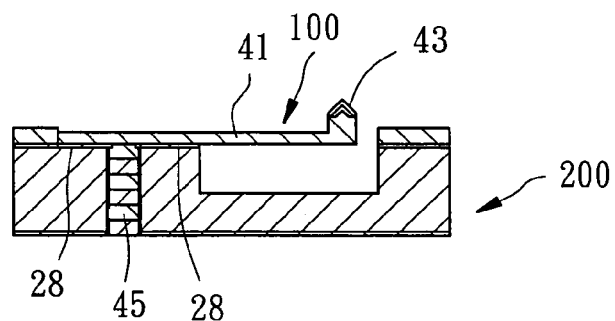
FIG. 7 is a schematic drawing, showing the micro contact device having the micro contact element and the base member according to the present invention.

FIGS. 6 and 7 show the bonding of the aforesaid micro contact element 100 and the aforesaid base member 200. As shown in FIG. 6, the insertion portion 45 of the micro contact element 100 is directly inserted through the coupling groove 513 of the base member 200 into the insertion hole 511, and then the metal bonding layer 28 is bonded to the base member 200 by soldering. Thereafter, stripping of the sacrificial layer 23 of the micro contact element by etching to separate the substrate 11 and the supplementary bonding portions 44 from the suspension arm 41 and the point 43, as shown in FIG. 7.

Thus, the micro contact element 100 and the base member 200 are firmly joined together with a part of the micro contact element 100 embedded in the base member 200, thereby forming a micro contact device.

Figure 8:
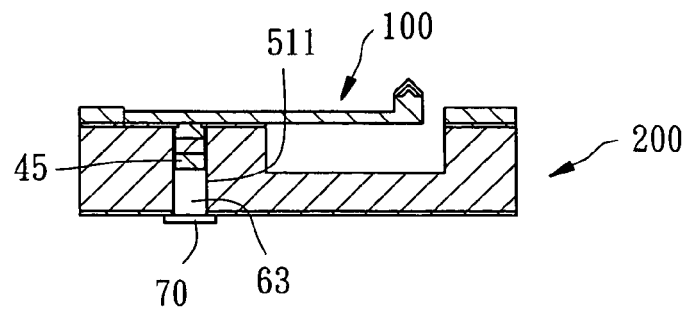
FIG. 8 is a schematic drawing, showing an alternative form of the micro contact device having the micro contact element and the base member according to the present invention.

A micro contact element thus obtained has the advantage of high precision of the positioning of the point of the micro contact element on the base member. Because the main contact point is close to the top side of the base member and the body of the contact element is kept inside the surface layer, the maintenance work can easily be performed without causing damage to other needle. Moreover, each separated testing unit corresponding to etch IC device can be alternative individually. The end of insertion portion 45 at the bottom of base member, shown in FIG. 7, can electrically connect to the external circuit. If the length of the insertion portion 45, shown in FIG. 8, is insufficient to pass through the insertion hole 511 of the base member 200, a conductive material 63 may be fitted into the insertion hole 511 for use as a medium to electrically connect the micro contact element 100 to an external circuit 70.

Figure 9:
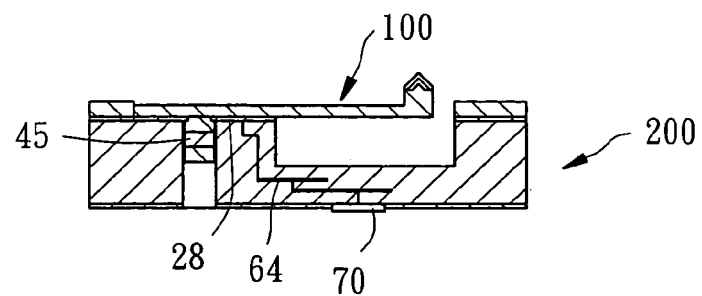
FIG. 9 is a schematic drawing, showing another alternative form of the micro contact device having the micro contact element and the base member according to the present invention.

Referring to FIG. 9, if the base member 200 already has a circuit layout 64, the metal bonding layer 28 of the micro contact element 100 can be connected to the circuit layout 64 of the base member 200 so that the micro contact element 100 can be electrically connected to an external circuit 70 through the circuit layout 64 of the base member 200. In this case, the insertion hole 511 can be either made not cut through or cut through the bottom surface of the silicon substrate 51; however, the depth of the insertion hole 511 should be sufficient for receiving the insertion potion 45.

Figure 10:
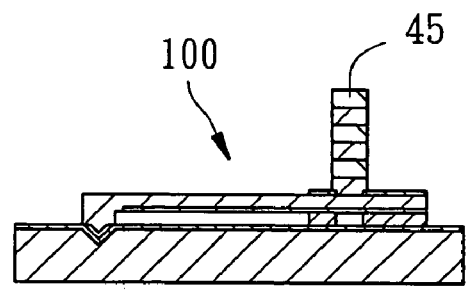
FIG. 10 is a schematic sectional side view of the micro contact element made according to the processes shown in FIG. 2a to FIG. 2ff.
Figure 11:
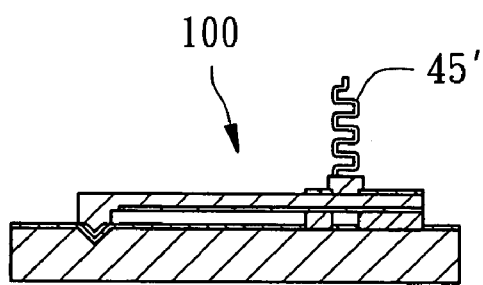
FIG. 11 is similar to FIG. 10 but showing an alternate form of the insertion portion of the micro contact element.
Figure 12:
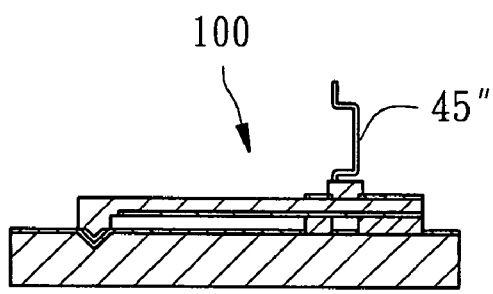
FIG. 12 is similar to FIG. 10 but showing another alternate form of the insertion portion of the micro contact element.
Figure 13:
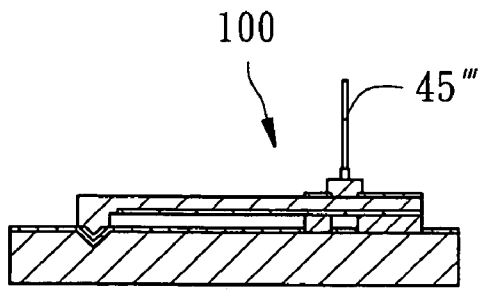
FIG. 13 is similar to FIG. 10 but showing still another alternate form of the insertion portion of the micro contact element.
Figure 14:
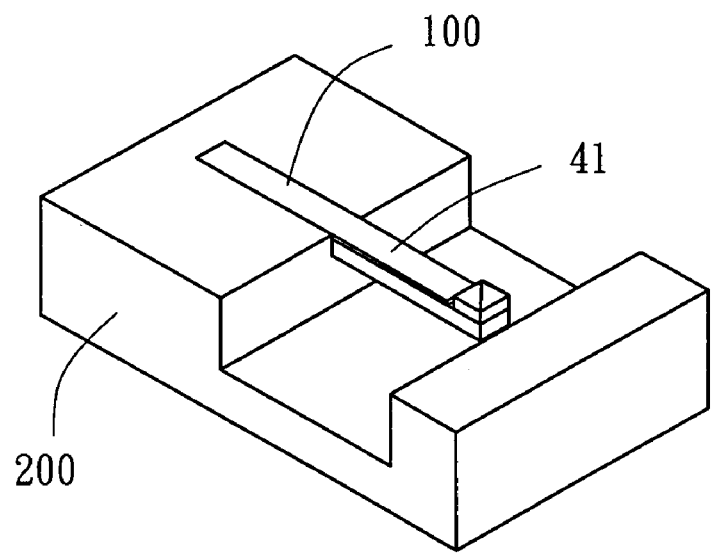
FIG. 14 is a perspective view of a micro contact element inserted into a base member according to the present invention.

The insertion portion 45 of the micro contact element 100 (see FIG. 10) may be various embodied. For example, the insertion portion can even have a springy structure. FIGS. 11-13 show different alternate forms of the insertion portion 45', 45", 45''' of the micro contact element 100. The insertion portion 45', 45", 45''' of the micro contact element 100 may have a straight, curved, or detoured profile extending in direction perpendicular to the base member. Further, the springy structure can be a laminated structure made through multiple electroforming and leveling procedures similar to the process shown in FIG. 2. Further, the springy structure of the insertion portion 45', 45", 45''' can be forced into contact or directly bonded to an external circuit.

Figure 15:
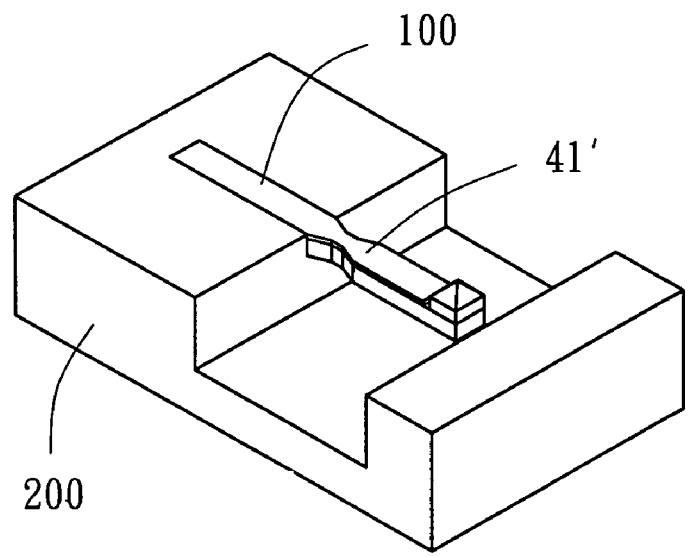
FIG. 15 is a perspective view of an alternate form of the micro contact element inserted into the base member according to the present invention.
Figure 16:
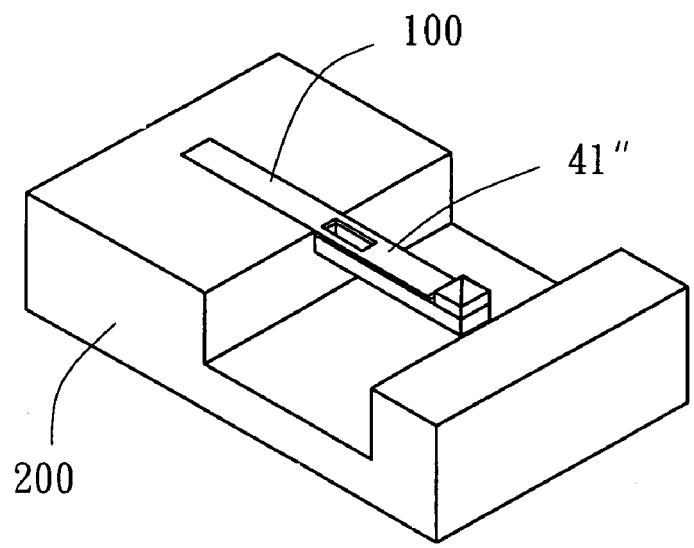
FIG. 16 is a perspective view of another alternate form of the micro contact element inserted into the base member according to the present invention.
Figure 17:
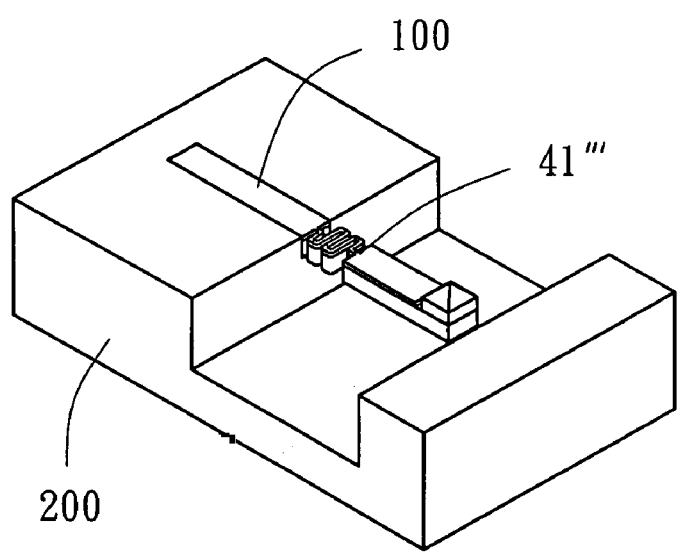
FIG. 17 is a perspective view of still another alternate form of the micro contact element inserted into the base member according to the present invention.

Referring to FIGS. 14-17, instead of the rigid rectangular structure of the suspension arm 41 of the micro contact element 100, the suspension arm 41 can be made having a deformable structure 41', 41" or 41''' on the middle as shown in FIGS. 15-17 so that the micro contact allows a relatively greater amount of deformation to fit the limited design area or thickness. Further, the design of the deformable structure allows adjustment of the stiffness of different sizes of the micro contact elements to the same level.

What is claimed is:

1. A micro contact device comprising:
    a base member having a substrate, an insertion hole, a receiving chamber with a predetermined width and depth, and a coupling groove; wherein said receiving chamber and said coupling groove respectively extend downwards from a top side of said substrate and said insertion hole extends downwards from a bottom side of said coupling groove; and
    a micro contact element having a suspension arm partially mounted in said coupling groove of said base member and partially suspending in said receiving chamber of said base member, said suspension arm having a first long side and a second long side opposite to said first long side, a point perpendicularly extending from an end of the first long side of said suspension arm, and an insertion portion perpendicularly extending from the second long side of said suspension arm and inserted into said insertion hole of said base member.

2. The micro contact device as claimed in claim 1, wherein a conductive material is filled in said insertion hole of said base member for electrically connecting said micro contact element to an external circuit.

3. The micro contact device as claimed in claim 1, wherein said insertion portion can electrically connecting said micro contact element to an external circuit.

4. The micro contact device as claimed in claim 2, wherein said micro contact element and said base member are firmly mounted to an element having said external circuit.

5. The micro contact device as claimed in claim 1, wherein said substrate of said base member has arranged therein a circuit layout for electrically connecting said micro contact element to an external circuit.

6. The micro contact device as claimed in claim 5, wherein said substrate is a circuit board having mounting grooves.

* * * * *